United States Patent
Araki et al.

[11] Patent Number: 6,163,224
[45] Date of Patent: Dec. 19, 2000

[54] PLL CIRCUIT AND METHOD OF CONTROLLING THE SAME

[75] Inventors: Yoshihiro Araki; Michimasa Yamaguchi, both of Kangawa, Japan

[73] Assignee: NEC Corporation, Tokyo, Japan

[21] Appl. No.: 09/378,707

[22] Filed: Aug. 23, 1999

[30] Foreign Application Priority Data

Aug. 24, 1998 [JP] Japan ................ 10-237834

[51] Int. Cl.[7] .................. H03B 5/06; H03L 7/06
[52] U.S. Cl. .................. 331/34; 331/45; 331/57; 331/173; 327/142; 327/156
[58] Field of Search .................. 331/34, 45, 57, 331/173, DIG. 2; 327/156–159, 142, 143; 375/376; 455/260

[56] References Cited

U.S. PATENT DOCUMENTS

| | | |
|---|---|---|
| 5,355,097 | 10/1994 | Scott et al. . |
| 5,596,302 | 1/1997 | Mastrocola et al. . |
| 5,767,748 | 6/1998 | Nakao . |
| 5,796,313 | 8/1998 | Eitan . |
| 5,905,759 | 5/1999 | Ishida et al. ............... 375/282 |
| 6,066,988 | 5/2000 | Igura ......................... 331/18 |

FOREIGN PATENT DOCUMENTS

| | | |
|---|---|---|
| 07 074625 | 3/1995 | European Pat. Off. . |
| 55-42443 | 3/1980 | Japan . |
| 58-59653 | 4/1983 | Japan . |
| 63-185121 | 7/1988 | Japan . |
| 4-20016 | 1/1992 | Japan . |
| 5-122032 | 5/1993 | Japan . |
| 7-74625 | 3/1995 | Japan . |
| 8-79068 | 3/1996 | Japan . |
| 8-307460 | 11/1996 | Japan . |
| 8-340241 | 12/1996 | Japan . |
| 9-326692 | 12/1997 | Japan . |

*Primary Examiner*—David Mis
*Attorney, Agent, or Firm*—McGinn & Gibb, P.C.

[57] ABSTRACT

A PLL circuit detects oscillation halt of a voltage control oscillator, generates an oscillation control signal for automatically oscillating the voltage control oscillator based upon the detected signal, and automatically restores the voltage control oscillator to a normal oscillation state by the use of the generated signal. The voltage control oscillator is structured by a ring oscillator in which a plurality of differential amplifiers are connected in a ring form. A plurality of oscillation control means are arranged for the respective inputs of the differential amplifiers so as to set the ring oscillator into an oscillationable state when the voltage control oscillator halts. The oscillation control means is controlled by the oscillating control signal.

10 Claims, 13 Drawing Sheets

PLL CIRCUIT AND METHOD OF CONTROLLING THE SAME

BACKGROUND OF THE INVENTION

This invention relates to a PLL (Phase-locked loop) circuit and a method of controlling the same, and in particular, to a PLL circuit which is capable of automatically restoring to a normal state when an oscillation operation is halted on the condition that an oscillation state of a voltage oscillation circuit (VCO) is monitored.

Recently, excessively fine resolution is given for a clock step operation to restore a data signal from a receiving signal in a communication system. To this end, a PLL (Phase-locked loop) circuit, which produces multi-phase clocks, has been required. When the phase number (2, 4, 8, 16, ... ) of the multi-phase clocks is equal to the Nth power of 2, a circuit for realizing the clock step operation does not require a redundant circuit. Consequently, the circuit can readily and simply be designed.

In this event, eight phase clocks are generally designed among the phase clocks of the Nth power of 2 in the system.

Hereinafter, description will be made about conventional references with respect to the multi-phase clocks.

(1) First conventional reference (Japanese Unexamined Patent Publication (JP-A) No. Hei. 4-20016):

The first conventional reference discloses a clock generator which has a ring oscillator including odd stages of delay circuits and which directly and separately produces output signals of a plurality of the delay circuits as clock signals of multi-phase.

Although this system is generally used, the system can not produce phase clocks of the Nth power of 2.

(2) Second conventional reference (Japanese Unexamined Patent Publication (JP-A) No. Sho. 58-59653):

The second conventional reference discloses a clock generator which has four phase detectors for detecting phase modulation signals of eight phase and which produce clock signals of eight phases by giving output signals of a voltage control oscillator for producing a single phase clock into the phase detector.

This system can produce the phase clocks (eight phase clocks) of Nth power of 2. However, operation speed of the detector is restricted. In consequence, the system can not produce high-speed clocks. Further, it is difficult in design to unify delay times of the four detectors.

(3) Third conventional reference (Japanese Unexamined Patent Publication (JP-A) No. Hei. 8-340241):

The third reference discloses an oscillator of multi-phase to which buffers are connected in series with a plurality of stages. With this structure, an output signal of the final stage is reversed, and is fed back into the first stage of the buffer. Herein, the each of the buffers is composed of two inverters.

In this system, delay time between output decision of the first stage and output decision of the final stage inevitably becomes large in comparison with times necessary to the other portions.

To solve these problems, it is necessary that the ring oscillator of the voltage control oscillator is structured by even devices. To this end, it has been tried to constitute the ring oscillator by using a delay circuit as a differential circuit and by connecting even delay circuits.

However, the following problems occur when the ring oscillator is structured by the even stages.

Namely, in case that the ring oscillator of the even stages is used, the oscillation operation may be halted by an affect of noise when a power supply is introduced.

In the ring oscillator of the even stages illustrated in FIG. 1, even differential amplifiers 81 through 84 are connected in series, and an input of first stage and an output of final stage are connected in a ring form. With such a structure, when the ring oscillator is normally oscillated, all outputs of the differential amplifier are put into unbalanced states. For example, when an output 803 is put into a high level, an output 804 is put into a low level.

In this circuit, when both inputs 801 and 802 of a differential amplifier 81 are put into high levels, outputs 803 and 804 of the differential amplifier 81 are put into low levels, outputs 805 and 806 of a differential amplifier 82 are put into high levels, outputs 807 and 808 of a differential amplifier 83 are put into low levels, and an output of a differential amplifier is put in to high level so as to be given to a first stage.

However, the same high levels are given to outputs 801 and 802 of the differential amplifier 81. Consequently, a normal oscillation state does not appear, and as a result, the oscillation operation inevitably halts.

Recently, the number of detachable devices is increased. Consequently, the number of device having no reset signal (power-on reset signal) when the power supply is introduced is also increased. Herein, it is to be noted that the conventional device has the reset signal.

In consequence, the device can not make an initial value of the PLL circuit. As a result, it is uncertain whether or not the voltage control oscillator accurately oscillates. To solve this problem, a technique, in which the system monitors the output of the PLL circuit and the system is automatically restored to the normal state when the oscillation operation is halted, has been researched.

For example, description has been made about a technique, in which a system monitors an oscillation of a voltage control oscillator in a PLL circuit and the system is automatically restored to the normal oscillation state when the oscillation is halted in Japanese Unexamined Patent Publication (JP-A) No. Hei. 7-74625.

A circuit illustrated in FIG. 2 includes a phase comparing circuit 91, a voltage generating circuit 92, a voltage control oscillator 93, and a self-restoring control circuit 94.

With such a structure, the phase comparing circuit 91 compares a referential signal 901 with an oscillation signal 904 and produces a phase difference detecting signal 902. The voltage generating circuit 92 converts the phase difference detecting signal 902 into a voltage 903. The voltage control oscillator 93 produces a frequency signal proportional to the voltage 903. The self-restoring control circuit 94 monitors the referential signal 901 and the oscillation signal 904, and supplies a self-restoring signal 905 into the phase comparing circuit 91.

In this case, the phase comparing circuit 91 gives the phase difference detecting signal 902 into the voltage generating circuit 92 on the basis of the self-restoring signal 905 given from the self-restoring control circuit 94 at a constant duration after the voltage control oscillator 93 halts. Thereby, the system is self-restored to the normal oscillation state.

However, this conventional technique has the following problems.

First, the voltage control oscillator having even stages of ring oscillator may halt the oscillation even when the voltage from the voltage generating circuit is normal. However, the system can not be automatically restored from this state.

This reason is explained as follows.

The voltage control oscillator having odd stages of ring oscillator inevitably and normally oscillates when the voltage from the voltage generating circuit is normal. The oscillation halts only when the voltage approaches a ground line GND level or a power supply line VDD level. When the oscillation halts, the self-restoring signal is given to the voltage generating circuit, and an output voltage of the voltage generating circuit is put into a normal value. Thus, the self-restoring control is carried out.

However, in this method, when the oscillation of the even stages of ring oscillator halts on the condition that the voltage from the voltage generating circuit is normal, the oscillation can not be restored.

Second, when the PLL circuit halts, it is possible to automatically restore in case that an output level is fixed to a low level. However, it is impossible to automatically restore in case that the output level is fixed to a high level. This is because the self-restoring control is carried out by detecting a timing at which the output level is fixed to the low level as the oscillation halting state.

Further, oscillation frequency is variable proportional to a control voltage from the voltage generating circuit in the ring oscillator. However, when the control voltage approaches the power supply line VDD level or the ground line GND level, the ring oscillator does not become the normal oscillation state, and the oscillation inevitably halts.

In a differential amplifier illustrated in FIG. 3, a drain of a transistor 705 is connected to a drain of a transistor 752. Further, drains of the transistors 751 and 753 are connected to each other. Sources of transistors 750 and 751 are coupled to a power supply line VDD. Sources of transistors 752 and 753 are connected to a drain of a transistor 754. A source of a transistor 754 is coupled to a ground line GND of a transistor 754.

Further, a gate of a transistor 750 is connected to a gate of a transistor 751 to form control input terminal 701 from an external circuit. A gate of a transistor 754 serves as an control input 704 from an external circuit.

Each of gates 702 and 703 of transistors 752 and 753 serves as an input terminal while each of drains 706 and 705 of transistors 752 and 753 serves as an output terminal.

When a high level is given to the input terminal 702 and a low level is given to the input terminal 703, the transistor 752 is put into an ON state, the output 706 is put into the low level, the transistor 753 is put into an OFF state, and the output 705 is put into the high level.

The voltage 903 from the voltage generating circuit 92 is applied to the control inputs 701 and 704 of the transistors 750, 751, and 754, and the delay time of the differential amplifier is variable in dependency upon the voltage. By utilizing this phenomenon, the oscillation frequency of the ring oscillator is changed.

However, when the control inputs 701 and 704 of the transistors 750, 751 and 754 approach the power supply line VDD level or the ground line GND level, each of the transistors 750, 751 and 754 is put into the OFF state, and no current flows.

Consequently, the circuit can not be operable as the differential amplifier, and as a result, the oscillation inevitably halts.

In addition, the related techniques have been disclosed in Japanese Unexamined Patent Publications No. Sho. 55-42443, Sho. 63-185121, Hei. 5-122032, Hei. 8-79068, Hei. 8-307460, and Hei. 9-326692.

SUMMARY OF THE INVENTION

It is therefore an object of this invention to provide a PLL (Phase-locked loop) circuit, which is capable of automatically restoring to a normal state when an oscillation halts.

It is another object of this invention to provide a PLL circuit which is capable of generating multi-phase clocks.

According to this invention, a PLL circuit detects oscillation halt of a voltage control oscillator, generates an oscillation control signal for automatically oscillating the voltage control oscillator based upon the detected signal, and automatically restores the voltage control oscillator to a normal oscillation state by the use of the generated signal.

With such a structure, the voltage control oscillator is structured by a ring oscillator in which a plurality of differential amplifiers are connected in a ring form.

Further, a plurality of oscillation control means are arranged for the respective inputs of the differential amplifiers so as to set the ring oscillator into an oscillationable state when the voltage control oscillator halts.

Under this circumstance, the oscillation control means is controlled by the oscillating control signal.

In this case, the number of the differential amplifiers is even.

Moreover, the oscillation control means pulls-up one input of the differential amplifier into a high level and pulls-down the other input of the differential amplifier into a low level.

In this event, the oscillation control means comprises a first oscillation control means which pulls-up the one input of the differential amplifier into the high level and a second oscillation control means which pulls-down the other input of the differential amplifier into the low level.

Specifically, the first oscillation control means comprises a p-channel transistor which is connected between the one input of the differential amplifier and a power supply line. The second oscillation control means comprises an n-channel transistor which is connected between the other input of the differential amplifier and a ground line.

Further, the circuit has second and third differential amplifiers. In this condition, one output of the differential amplifier constituting the ring oscillator is introduced to a non-reverse input terminal of the second differential amplifier while the other output of the differential amplifier is introduced to a reverse input terminal of the second differential amplifier.

Moreover, one output of the differential amplifier constituting the ring oscillator is introduced to a reverse input terminal of the third differential amplifier while the other output of the differential amplifier is introduced to a non-reverse input terminal of the third differential amplifier. Thereby, a plurality of frequencies are generated. Each of the frequency has a predetermined phase difference for the ring oscillator.

In addition, the circuit has a detection circuit which detects the oscillation halt of the voltage control oscillator. The detection circuit comprises a divider, a first data retaining means, a second date retaining means, an exclusive OR gate.

With this structure, the divider divides the oscillation signal of the voltage control oscillator.

The first data retaining means retains a first output signal which is given from the divider at a first time while the second data retaining means retains a second output signal which is given from the divider at a second time after a predetermined time from the first time. The exclusive OR gate detects the presence or absence of difference between the first output signal and the second output signal.

Each of the first data retaining means and the second data retaining means is reset by the use of the oscillation control signal.

Moreover, the circuit has a detection circuit which detects the oscillation halt of the voltage control oscillator.

The detection circuit comprises a divider, a plurality of shift registers, and an exclusive OR gate. With this structure, the divider divides the oscillation signal of the voltage control oscillator. A plurality of shift registers sequentially shift the divided signals. The exclusive OR gate detects the presence or absence of difference between an input signal and an output signal of each shift register. Each of the shift registers is reset by the use of the oscillation control signal.

More specifically, the ring oscillator portion is composed of even stages differential amplifiers. Consequently, the multi-phase clocks of N power of 2 can be produced with a simple circuit.

Further, the oscillation monitoring circuit always monitors the oscillation state of the PLL circuit, and gives the reset signal into the voltage control oscillator so as to be oscillationable state using the oscillation halt as a trigger when the oscillation monitoring circuit detects the oscillation halt. In consequence, when the oscillation of the PLL circuit halts, the PLL circuit can be automatically restored.

Moreover, even when the control voltage approaches the power supply line VDD level or the ground line GND level, an additional circuit is provided so that the oscillation of the ring oscillator does not halts. As a result, a stable oscillation can be always carried out when the control voltage of the voltage control oscillator falls within the range between the power supply lineVDD and the ground line GND.

In addition, when the oscillation halts, the ring oscillator of the voltage control oscillator is directly reset into the oscillation state. Consequently, when the oscillation of the PLL circuit halts, the PLL circuit can accurately return into the oscillation state.

DESCRIPTION OF PREFERRED EMBODIMENTS

Referring to drawings, description will be made about embodiments of this invention.

Figure 1:
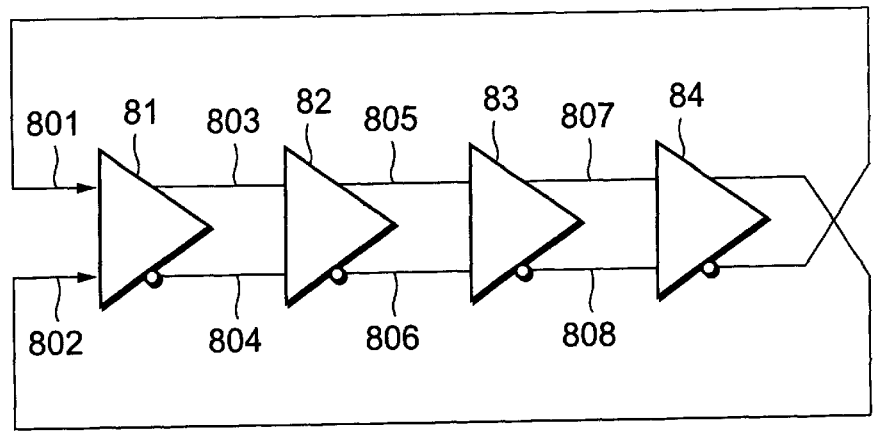
FIG. 1 is a block diagram showing a related ring oscillator.
Figure 2:
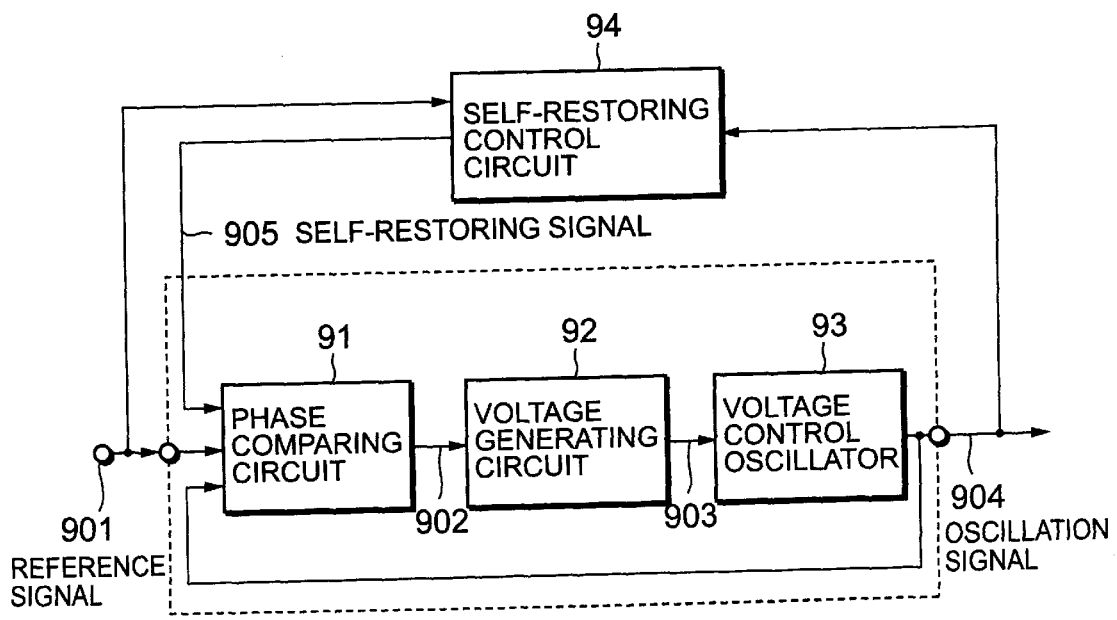
FIG. 2 is a block diagram showing a related PLL circuit.
Figure 3:
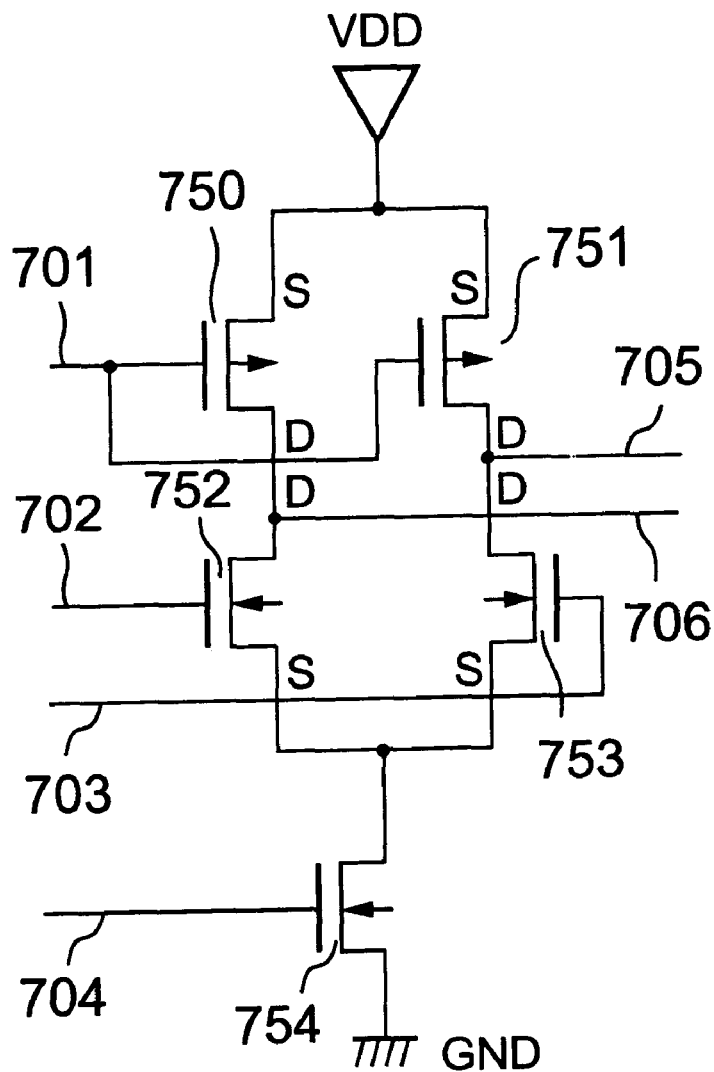
FIG. 3 is a circuit diagram showing a differential amplifier constituting each stage of the related ring oscillator.
Figure 4:
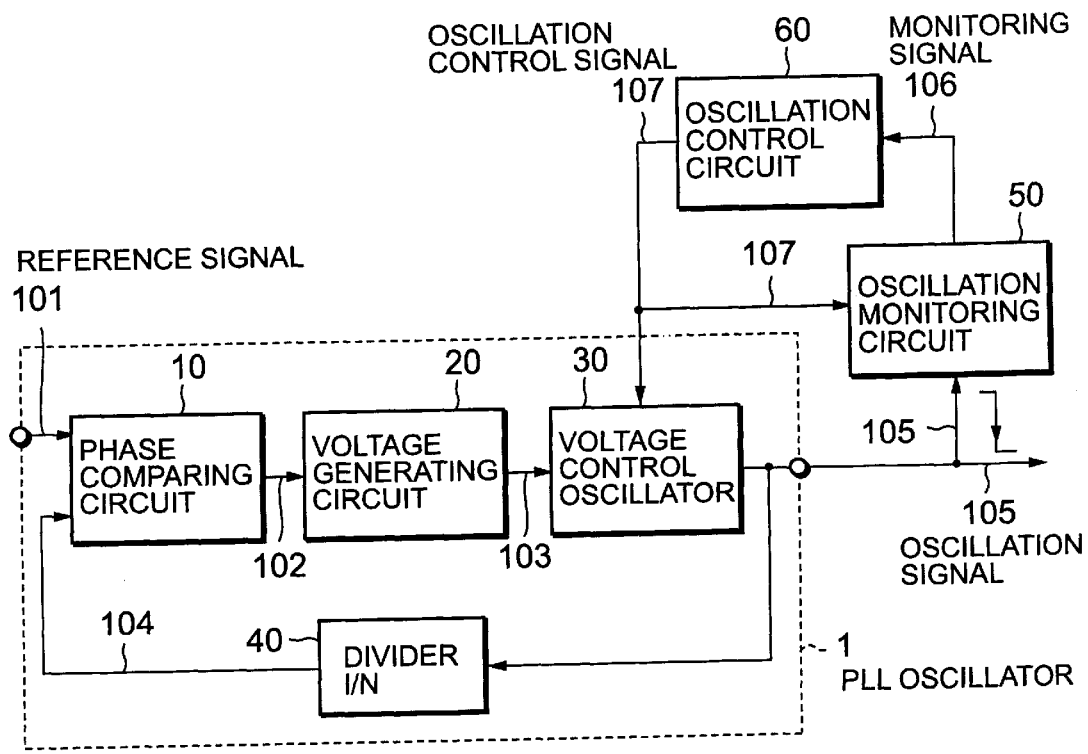
FIG. 4 is a block diagram showing a PLL circuit according to this invention.
Figure 5:
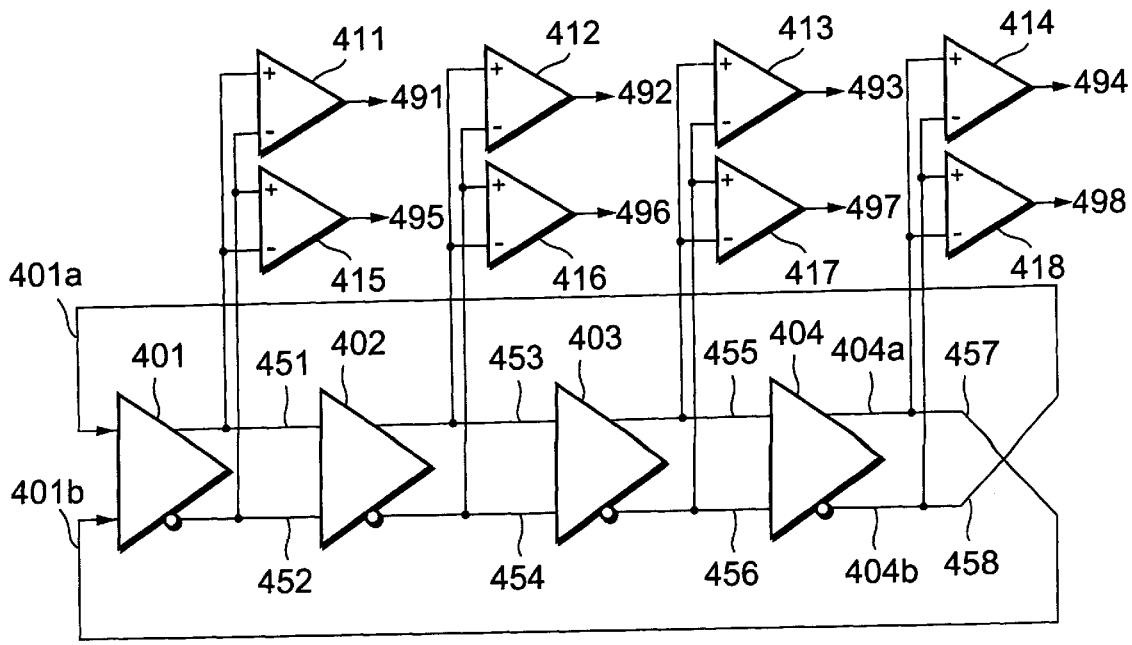
FIG. 5 is a block diagram showing a ring oscillator which is structured with even stages and which generates eight phase clocks.

In FIGS. 4 and 5, a PLL (Phase-locked loop) circuit detects halt of an oscillation of a voltage control oscillator 30, generates an oscillation control signal 107 for automatically oscillating the voltage control oscillator on the basis of the detected signal, and restores the voltage control oscillator 30 to a normal state by the use of the signal 107.

The voltage control oscillator 30 is structured by a ring oscillator in which a plurality of differential amplifiers 32 through 35 are connected in a ring form and oscillation control means P1–P4 and N1–N4 is provided for each input of each differential amplifier 32–35. Herein, the oscillation control means sets the ring oscillator into an oscillationable state when the oscillation of the voltage control oscillator 30 halts. In this event, the oscillation control means P1–P4 and N1–N4 is controlled by the oscillation control signal 107.

With such a structure, the number of the differential amplifiers is even. Further, one input of the differential amplifier is pulled-up to a high level while the other input of the differential amplifier is pulled-down to a low level.

In FIG. 5, there are provided with a second differential amplifier 411 and a third differential amplifier 415. One output of a differential amplifier 401 constituting the ring oscillator is coupled to a non-reverse input terminal (+) of the second differential amplifier 411 while the other output of the differential amplifier 401 is coupled to a reverse input terminal (−) of the second differential amplifier 411.

Further, one output of a differential amplifier constituting the ring oscillator is coupled to a non-reverse terminal (−) of the third differential amplifier 495 while the other output of the differential amplifier 401 is coupled to non-reverse input terminal (+) of the third differential amplifier 495.

With this structure, a plurality of frequencies 491–498 having a desired phase difference for the ring oscillator are generated in the PLL circuit.

Figure 8:
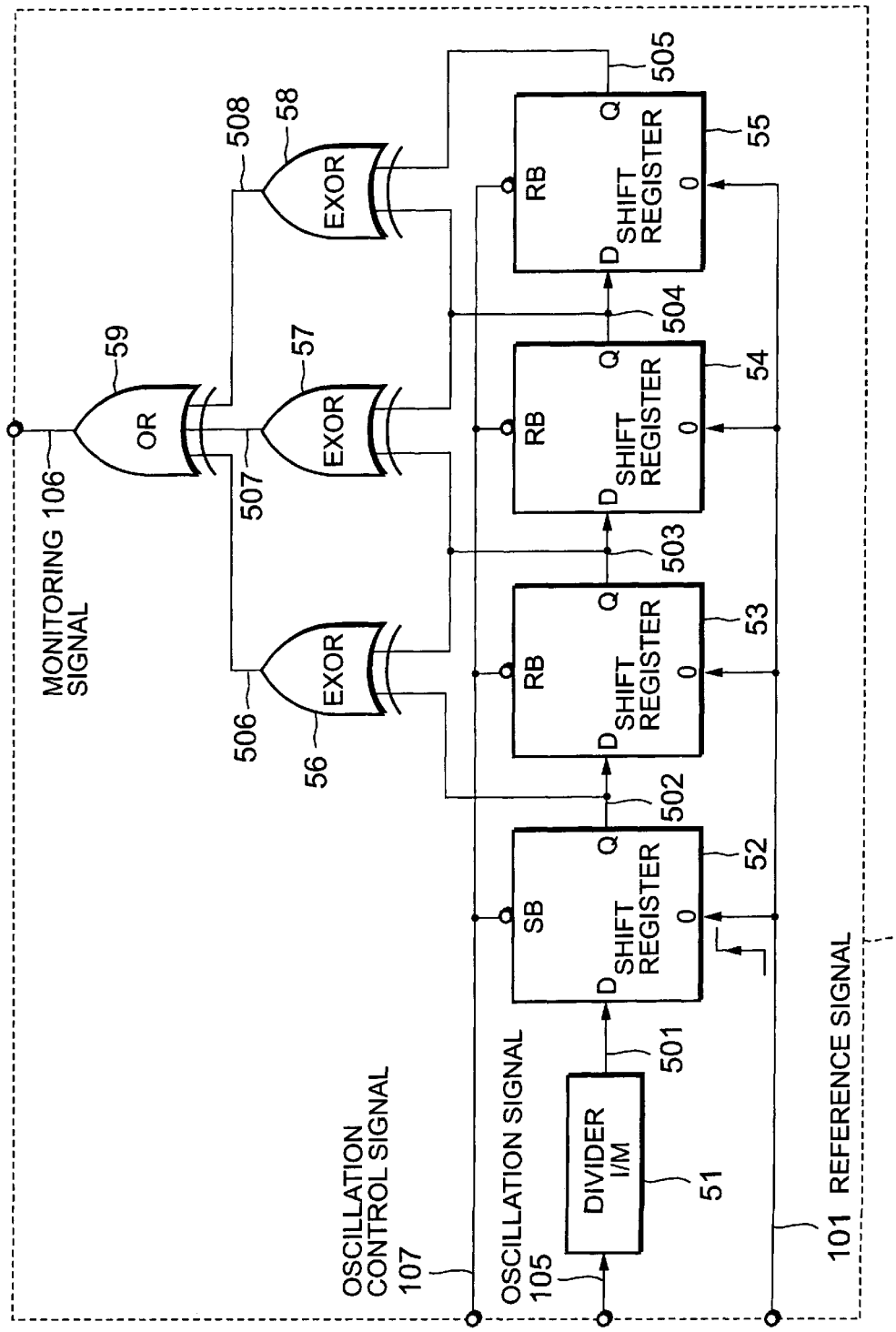
FIG. 8 is a circuit diagram showing an oscillation monitoring circuit.

In FIG. 8 (FIG. 14), an oscillation monitoring circuit 50 for detecting the oscillation halt of the voltage control oscillator 30 includes a divider 51 (402), a first data retaining means 52 (404), a second data retaining means 53 (405), and an exclusive-OR gate 59 (406). In this event, the divider 51 (402) divides an oscillation signal 105 of the voltage control oscillator 30. The first data retaining means 52 (404) retains a first output signal 502 (454) at a first time outputted from the divider 51 (402).

The second data retaining means 51 (402) retains a second output signal 503 (454) outputted from the divider 51 (402) at a second time after a predetermined time from the first time. The exclusive-OR gate 59 (406) detects the presence or absence of difference between the first output signal 502 and the second output signal 503.

With this structure, the first data retaining means 52 (404) and the second data retaining means 53 (405) are reset by the oscillation control signal 107 in the PLL circuit.

Further, the oscillation control oscillator 50 includes a divider 51, a plurality of shift registers 52–55, exclusive-OR gates 56–58. In this case, the divider 51 divides an oscillation signal 105 of the voltage control oscillator 30. The shift registers 52–55 sequentially shift the signals divided by the divider 51.

The exclusive-OR gates 56–58 detect the presence or absence of difference between an input signal and an output signal of each shift register 52–55. In this event, the shift registers 52–55 are rest by the oscillation control signal 107 in the PLL circuit.

Subsequently, detail description will be made about an embodiment of this invention.

Referring to FIG. 4, a PLL circuit includes a PLL oscillator 1, which is composed of a divider 40, a phase comparing circuit 10, a voltage generating circuit 20 and a voltage control oscillator 30, an oscillator monitoring circuit 50, and an oscillator control circuit 60.

With such a structure, the divider 40 divides an oscillating signal 105 into N number. The phase comparing circuit 10 compares the phase between the divided signal 104 and a referential signal 101 and produces a phase difference signal 102. The voltage generating circuit 20 converts the phase difference signal 102 into a voltage. The voltage control oscillator 30 changes an oscillation frequency proportional to the voltage 103.

Further, the oscillation monitoring circuit 50 monitors an oscillation state of the oscillation signal 105 of the PLL oscillator 1 and produces the presence or absence of the oscillation as an monitoring signal 106. The oscillation control circuit 60 produces an oscillation control signal 107 for controlling the voltage control oscillation circuit 30 by the use of the monitoring signal 106.

Subsequently, detail description will be made about the voltage control oscillator 30 of the PLL oscillator 1 illustrated in FIG. 4.

With respect to the phase comparing circuit 10, the voltage generating circuit 20 and the divider 40, the detail structure will be omitted because they are well known in the art.

Further, a ring oscillator is used as an oscillation portion of the voltage control oscillator 30. The structure except the oscillation portion has been well known in the art. Therefore, the specific structure will be omitted.

In the ring oscillator illustrated in FIG. 5, even number of differential amplifiers 401–404 are connected in series. In this event, a positive input of a first stage 401 is coupled to a negative output 404b of a final stage 404 while a negative input 401b of a first stage is coupled to a positive input 404a of a final stage 404.

Thereby, the ring oscillator is structured in a ring form. With this structure, the oscillation frequency depends upon only delay time of the differential amplifiers 401, 402, 403 and 404.

A voltage comparator 411 compares a positive output 451 and a negative output 452 as outputs of the differential amplifier 401 in level. As a result of the comparison, when the level of the positive phase 451 is higher, the voltage comparator 411 produces a high level to an output 491. When the level is not higher, the voltage comparator 411 produces a low level. Each of the voltage comparators 412–418 is structured in the same manner.

A plus input of the voltage comparator 415 is coupled to the negative output 452 of the differential amplifier 401 while the minus input is coupled to the positive output 451.

Outputs of the differential amplifiers 402–404 are coupled to the voltage comparators 412, 416, 413, 417, 414 and 418 so as to produce outputs 491–498.

Although description has been so far about the ring oscillator composed of four stages differential amplifiers, the ring oscillator composed of differential amplifier of 2×N number (N=1, 2, 3, . . . ) may be structure in the same manner.

Figure 6:
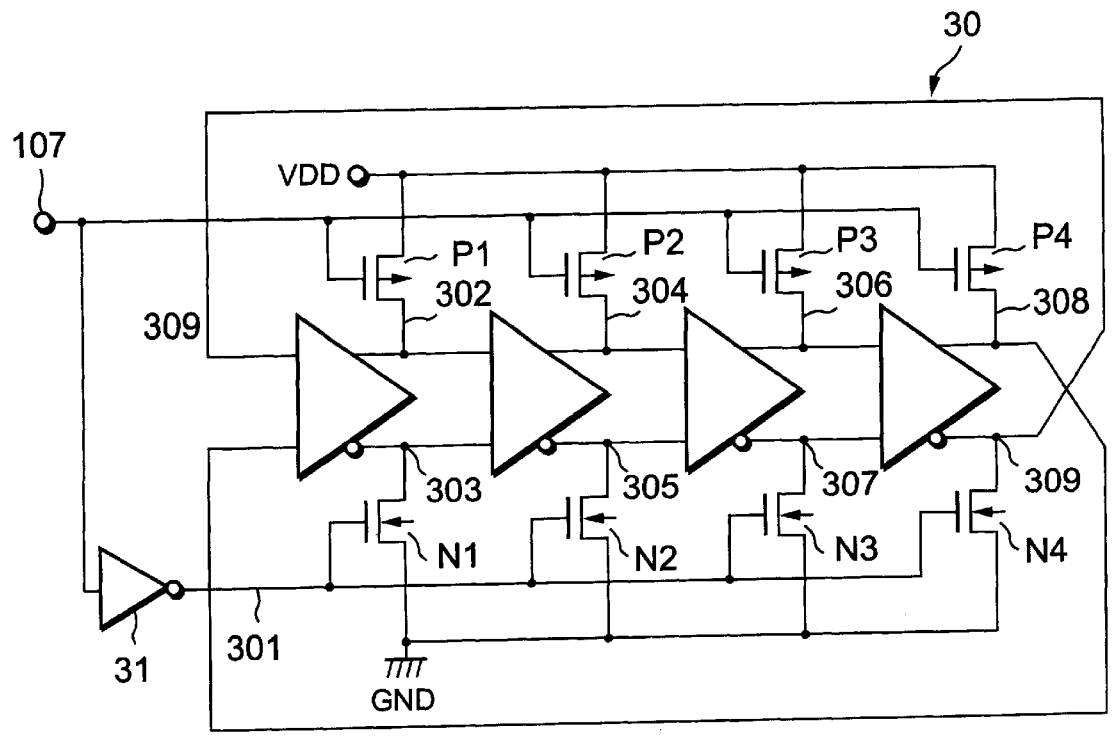
FIG. 6 is a circuit diagram showing a ring oscillator which has reset circuits for resetting the ring oscillator into an oscillationable state.

In the ring oscillator illustrated in FIG. 6, even number of differential amplifiers 32–35 are connected in series. With this structure, a positive input of a first stage is coupled to a negative output of a final stage while a negative output of the first stage is coupled to a positive output of the final stage. Thus, the ring oscillator is structured in a ring form. Under this circumstance, oscillation frequency depends upon delay time of the differential amplifier.

Each of P-type electric field transistors P1–P4 and N-type electric field transistors N1–N4 serves as a control device for self-restoring the oscillator, and is connected to each of output terminals 302–309 of the differential amplifiers 32–35.

In the P-type electric effect transistor P1, a drain is coupled to a positive output 302 of the differential amplifier 32 while a source is connected to a power supply line VDD.

In the N-type electric field transistor N1, a drain is coupled to a negative output 303 of the differential amplifier 32 while a source is coupled to a ground line GND. Transistors P2–P4 and N2–N4 are connected to the differential amplifiers 33–35 in the same manner.

Each gate of the transistors N1–N4 is given with a signal which is reversed the oscillation control signal 107, from the oscillation control circuit 60 illustrated in FIG. 4 by a reverse gate 31. On the other hand, each gate of the transistors P1–P4 is given with the oscillation control signal 107.

Each of the transistors P1–P4 and N1–N4 is turned off when the oscillation control signal 107 becomes the high level, and is turned on when the signal 107 becomes the low level.

Although description has been so far about the ring oscillator composed of four stages differential amplifiers, the ring oscillator composed of differential amplifier of 2×N number (N=1, 2, 3, . . . ) may be structured in the same manner.

Figure 7:
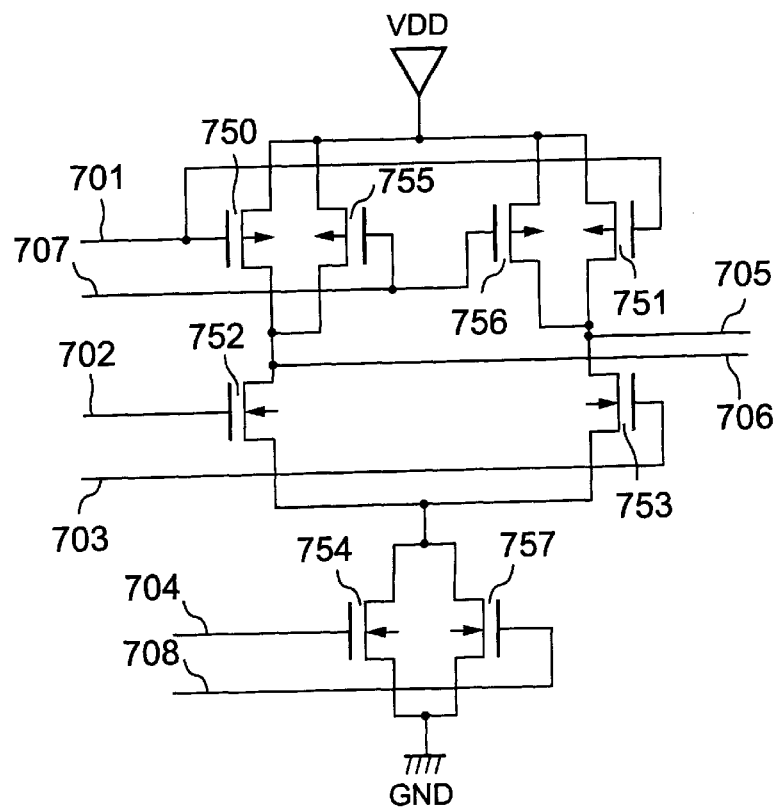
FIG. 7 is a circuit diagram of a differential amplifier constituting each stage of a ring oscillator.

In FIG. 7, the differential amplifier includes a differential amplifier portion which is composed of P-type transistors 750, 751 and N-type transistors 752, 753, a P-type transistor 755 which is connected to the P-type transistor 750 in parallel, a P-type transistor 756 which is connected to the P-type transistor 751 in parallel, and an N-type transistor 757 which is connected to the N-type transistor 754.

In the differential amplifier portion, a drain of the transistor 750 is coupled to a drain of the transistor 752, a drain of the transistor 751 is coupled to a drain of the transistor 753, and each source of the transistors 750, 751 is connected to the power supply line VDD.

Further, each source of the transistors 752, 753 is coupled to a drain of the transistor 754, and a source of the transistor 754 is coupled to the ground line GND. A gate of the transistor 750 is connected to a gate of the transistor 751 so as to constitute a control input terminal 701 from an external. A gate of the transistor 754 also serves as a control input terminal 704 from the external.

Input terminals of the differential amplifier serve as gates 702, 703 of the transistors 752, 753 while output terminals serve as drains 706, 705 of the transistors 752, 753.

Moreover, a gate of the transistor 755 is connected to a gate of the transistor 756 so as to constitute a control input terminal 707 from the external. A gate of the transistor 757 also constitutes a control input terminal 708 from the external.

The oscillation monitoring circuit 50 illustrated in FIG. 8 always monitors whether or not the PLL oscillator oscillates and produces the monitor signal which indicates the oscillation state.

The oscillation monitoring circuit 50 includes a divider 51, shift-registers 52–55, exclusive OR-gates 56–58, and an OR-gate 59, as illustrated in FIG. 8.

With such a structure, the divider 51 divides the oscillation signal 105 into the M number, and supplies the divided signal 501 into the shift register 52. The shift register retains a level of an input 501 at a timing in which the referential signal 101 is changed from the low level into the high level, and produces as a signal 502.

An operation of each shift-register 53–55 is carried out in the same manner. Namely, the shift register 53 retains a level of a signal 502 at timing in which the referential signal 101 is changed from the low level into the high level, and produces as a signal 503.

Similarly, the shift register 54 shifts a signal 503 at a timing of the referential signal 101 and produces a signal 504 while the shift register 55 shifts a signal 504 to produce a signal 505.

Further, the oscillation control signal 107 is given into a set terminal SB of the shift register 52 and reset terminals RB of the shift registers 53–55. Under this circumstance, when the oscillation control signal 107 is put into the low level, an output of the shift register 52 is put into the high level, and each output of the shift registers 53–55 is put into the low level.

When the oscillation control signal 107 is put into the high level, each of the shifts registers 52–55 normally operate. When the exclusive OR gate 56 produces the low level as the output signal 506 when both signals 502, 503 are equal to the high levels or the low levels.

The exclusive OR-gate 57 which is given with signals 503, 504 and the exclusive OR-gate 58 which is given with signals 504, 505 operate in the same manner.

The OR gate 59 produces the low level as the monitor signal 106 when all of signal 506–508 are equal to the low levels. That is, the low level is produced as the monitor signal 106 when all of output signals 502–505 are put into the high levels or the low levels.

Figure 9:
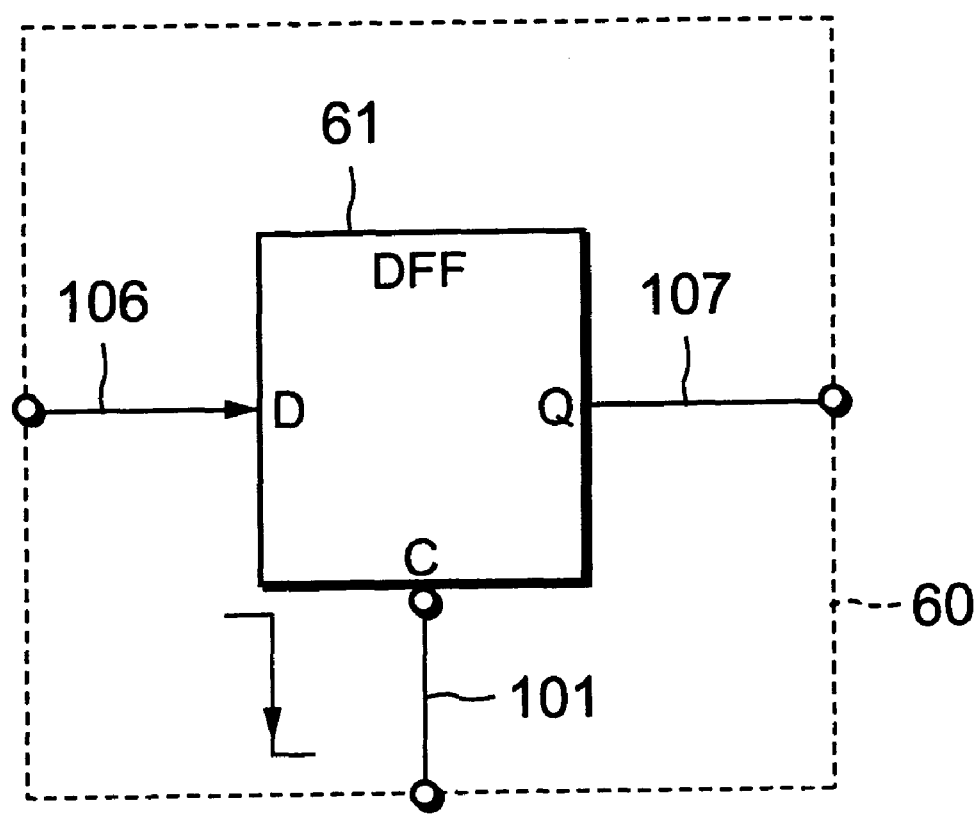
FIG. 9 is a circuit diagram showing an oscillation control circuit.

The oscillation control circuit 60 illustrated in FIG. 9 produces a pulse signal so that the voltage control oscillator 30 can resume the oscillation when an oscillation-halting signal is given thereto. In FIG. 9, the oscillation control circuit 60 is composed of a D flip-flop 61. The D flip-flop produces and retains the level of the monitor signal 106, which is given when the referential signal 101 is changed from the high level into the low level, as the oscillation control signal 107.

Subsequently, description will be made about an operation of the circuit illustrated in FIG. 4 with reference with FIG. 10.

When the PLL oscillator 1 normally oscillates, the oscillation monitoring circuit 50 produces the monitor signal, which indicates the oscillation state, into the oscillation control circuit 60. In this case, the oscillation control circuit does not produce the oscillation control signal 107.

When the PLL oscillator 1 halts the oscillation, the oscillation monitoring circuit 50 produces the monitor signal 106 of the low level, which indicates the halt of the oscillation, into the oscillation control circuit 60. Further, the oscillation control circuit 60 produces the oscillation control signal 107 into the voltage control oscillator 30 on the basis of the monitoring signal 106, resets the voltage control oscillator 30 into the oscillation state, and automatically restores the oscillation of the PLL circuit 1.

Figure 10:
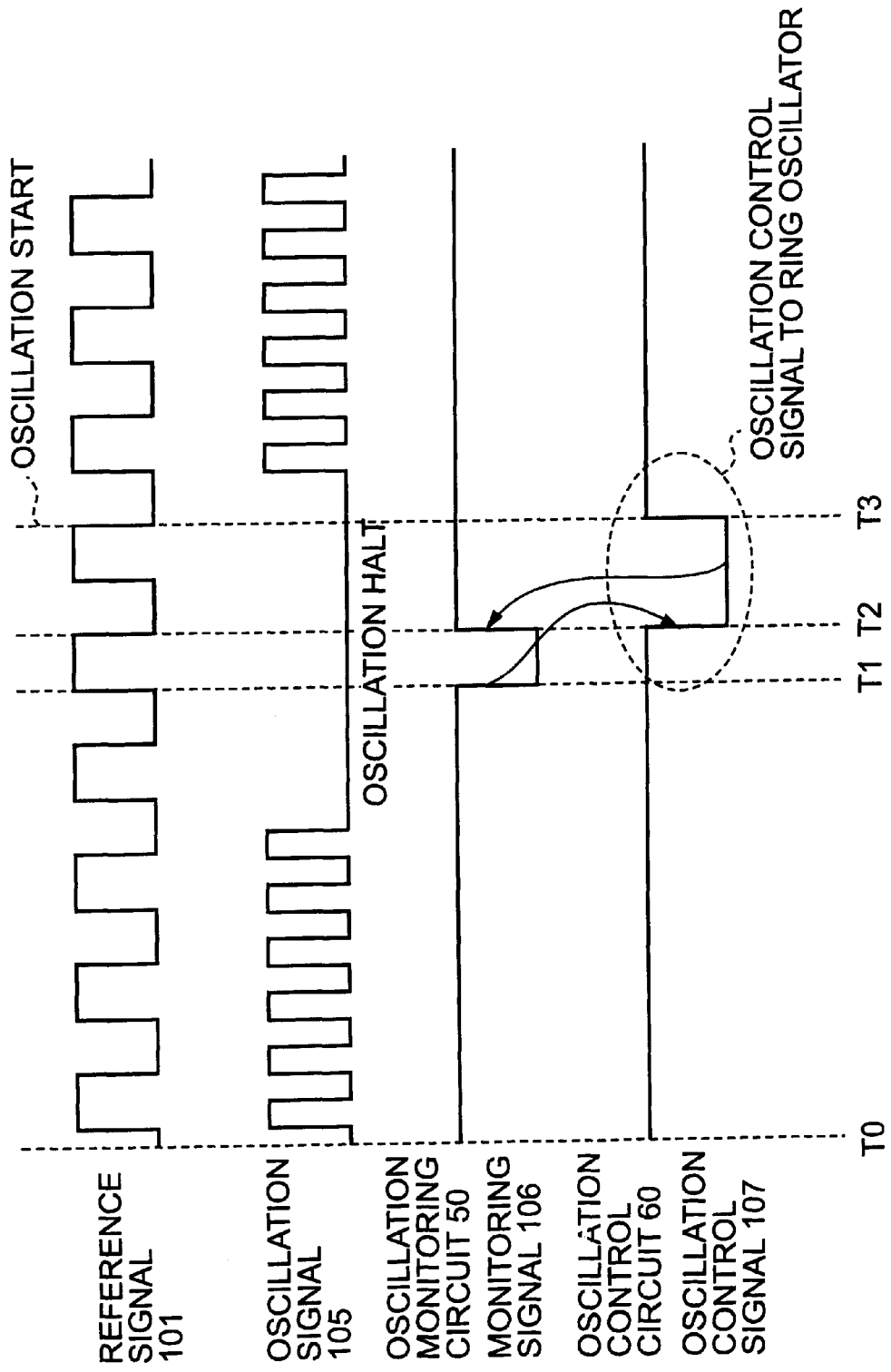
FIG. 10 is a waveform diagram for explaining an operation of this invention.

Referring to FIG. 10, the oscillation monitoring circuit 50 monitors the oscillation signal 105 of the PLL oscillator 1 in time T0–T1, and puts the monitor signal 106 into the high level, which indicates the oscillation state, because the PLL oscillator 1 is in the oscillation state. Further, the oscillation control signal 107 as the output of the oscillation control circuit 60 is also put into the high level, and the voltage control oscillator 30 is particularly controlled.

In time T1, the oscillation monitoring circuit 50 detects the oscillation halt of the oscillation signal 105, the oscillation monitoring circuit 50 puts the monitoring signal into the low level which indicates the oscillation halt.

The monitor signal 106 becomes the low level at falling time T2 of the referential signal 101. Consequently, the oscillation control circuit 60 puts the oscillation control signal into the low level, resets the shift register of the oscillation monitoring circuit 50, and puts the monitor signal 106 into the high level at falling time T3 of the referential signal 101.

In time T2–T3, the oscillation control signal becomes the low level. In consequence, each differential amplifier of the ring oscillator of the voltage control circuit 30 is reset into the oscillationable state, and starts the normal oscillation.

Referring to FIG. 10, the oscillation monitoring circuit 50 monitors the oscillation signal 105 of the PLL oscillator 1 in time T0–T1, and puts the monitor signal 106, which indicates the oscillation state, into the high level. Further, the oscillation monitoring circuit 50 puts the oscillation control signal 107 as the output of the oscillation control circuit 60 into the high level, and does not particularly control the voltage control oscillator 30.

In time T1, when the oscillation monitor circuit 50 detects the oscillation halt of the oscillation signal 105, the oscillation monitoring circuit 50 puts the monitor signal 106 into the low level which indicates the oscillation halt.

The monitor signal 106 becomes the low level at falling time of the referential signal 101. Consequently, the oscillation control circuit 60 puts the oscillation control signal 107 into the low level, resets the shift register of the oscillation monitoring circuit 50, and puts the monitor signal 106 into the high level at falling time T3 of the referential signal 101.

At time T2–T3, the oscillation control signal 107 becomes the low level. Thereby, each differential amplifier of the ring oscillator of the voltage control oscillator circuit 30 is reset into the oscillationable state, and the normal oscillation starts.

Figure 11:
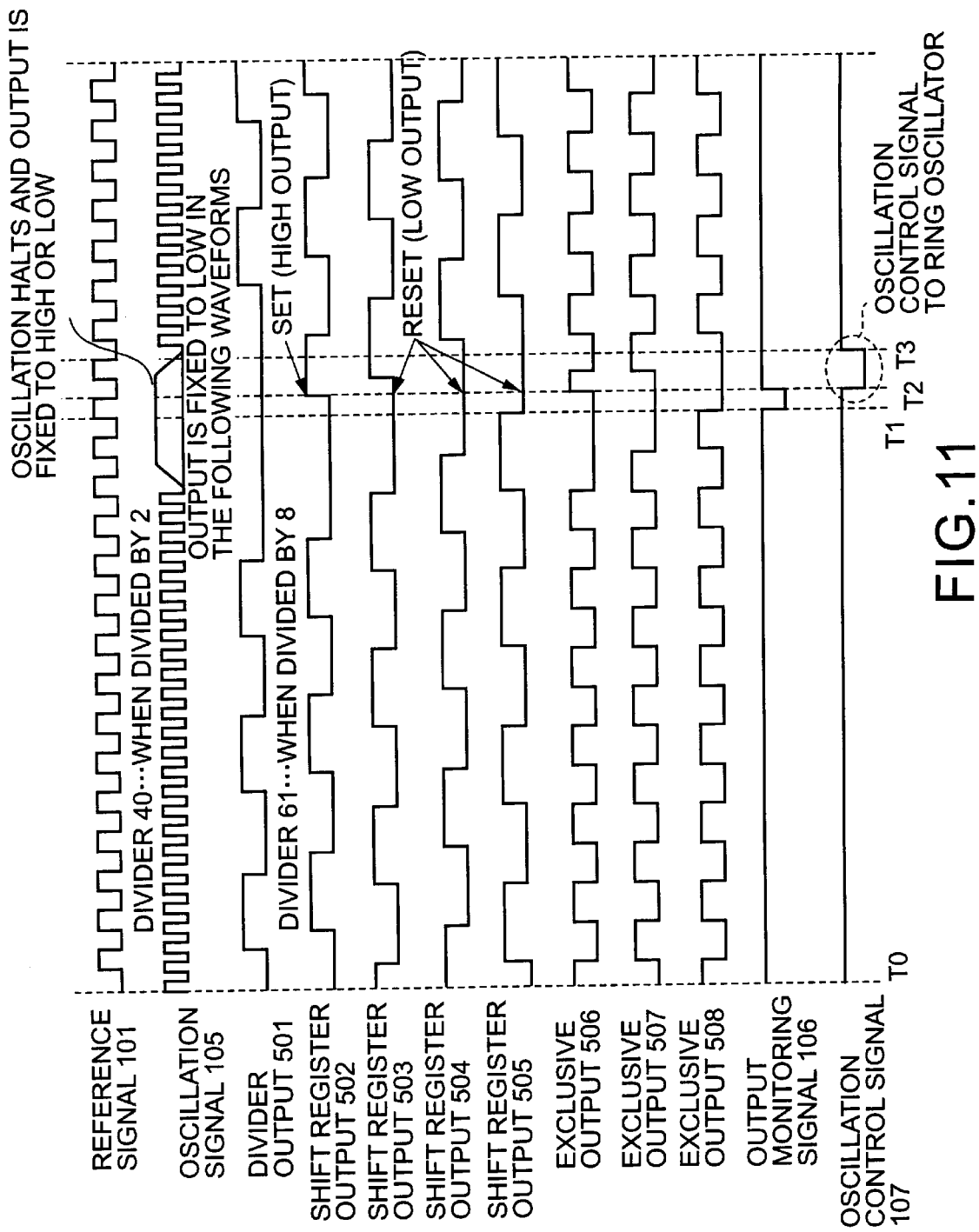
FIG. 11 is a waveform diagram for explaining an operation of this invention.

Referring to FIG. 11, description will be made about a detail operation of the ring oscillator portion illustrated in FIG. 6, FIG. 8 and FIG. 9, the oscillation monitoring circuit 50 and the oscillation control circuit 60.

In FIG. 11, the oscillation signal 105, which is given to the oscillation monitoring circuit 50, is divided by the divider 51 (eight division number in FIG. 11), and is supplied to the shift register 52. Each of shift registers 52–55 operates in synchronism with the rising of the referential signal 101, and the input data shifts in the direction from the shift register 52 into the shift register 55 at every rising of the referential signal 101.

When the PLL circuit 1 is put into the oscillation state, outputs 502–505 of the shift registers 52–55 are always mixed with the high level and the low level, and either of the exclusive OR-gates 56–58 produces the high level. Consequently, the monitor signal 106 as the output of the OR-gate 59 is always put into the high level. Therefore, the monitor signal 106 of the oscillation monitoring circuit 50 always produces the high level when the PLL circuit 1 is put into the oscillation state.

The D flip-flop 61 of the oscillation control circuit 60 continues so as to produce the high level into the oscillation control signal 107 because the monitor signal 106 is put into the high level.

The oscillation control signal 107 is coupled to the set terminal and the reset terminal of the shift registers 52–55 of the oscillation monitoring circuit 50. In this event, each of the shift registers 52–55 is not set into the reset state and carries out the normal operation because the oscillation control signal 107 is put into the high level.

In the ring oscillator illustrated in FIG. 6, the P-type transistors P1–P4, each of which is given with the high level signal 107 and the N-type transistors N1–N4, each of which is given with the low level signal 301 via the reverse gate 31, are put into OFF states not to be connected to the transistors. In consequence, the normal ring oscillator is structured so as to perform the oscillation.

When the oscillation signal 105 halts and is fixed to the low level, the outputs of the shift registers 52–55 sequentially become the low level. At time T1, all of output signals 502–505 of the shift registers 52–55 are put into the low level, all of outputs of the exclusive OR-gates 56–58 are put into the low level, and the monitor signal 106 as the output of the OR-gate 59 is put into the low level.

The D flip-flop 61 of the oscillation control circuit 60, which is given with the output monitor signal 106 of the low level, puts the oscillation control signal 107 into the low level at falling time T2 of the referential signal 101.

In the shift registers 52–55 of the oscillation monitoring circuit 50, the shift register 52 is set, the output of the shift register 52 is put into the high level, the shift registers 53–55 are reset, and the output of the shift registers 53–55 are put into the low level because the oscillation control signal 107 becomes the low level. Further, the exclusive OR-gate 56 becomes the high level, and the monitor signal 106 of the OR-gate 59 is also changed from the low level into the high level.

In the ring oscillator circuit, the P-type transistors P1–P4, each of which is given with the low level signal 107 and the N-type transistors N1–N4, each of which is given the high level signal 301 by the reverse gate 31, are put into the ON state.

In this case, all of output terminals of the differential amplifiers, in which the P-type transistors are connected, become the power supply VDD level while all of output terminals of the differential amplifiers, in which the N-type transistors are connected, become the ground line GND level.

In the D flip-flop 61 of the oscillation control circuit 60, the monitor signal 106 is put into the high level at time T3 in which the referential signal subsequently falls. Consequently, the oscillation control signal is changed from the low level into the high level.

In the ring oscillator circuit, the P-type transistors P1–P4, each of which is given with the oscillation control signal 107 of the high level and the N-type transistors N1–N4, each of which is given with the low-level signal by the reverse gate 31, become the OFF state.

In consequence, each potential of outputs 302–309 of the differential amplifiers 32–25 is changed from the power supply line VDD level or the ground line GND level into the intermediate potential level direction, and becomes the oscillation state in the course.

Although description has been so far about the case that the oscillation halts at the low level, even when the oscillation halts at the high level, the oscillation monitoring circuit 50 detects the oscillation halt, and puts the monitor signal 106 into the low level or puts the oscillation control signal 107 into the low level to be able to automatically restore the oscillation.

Figure 12:
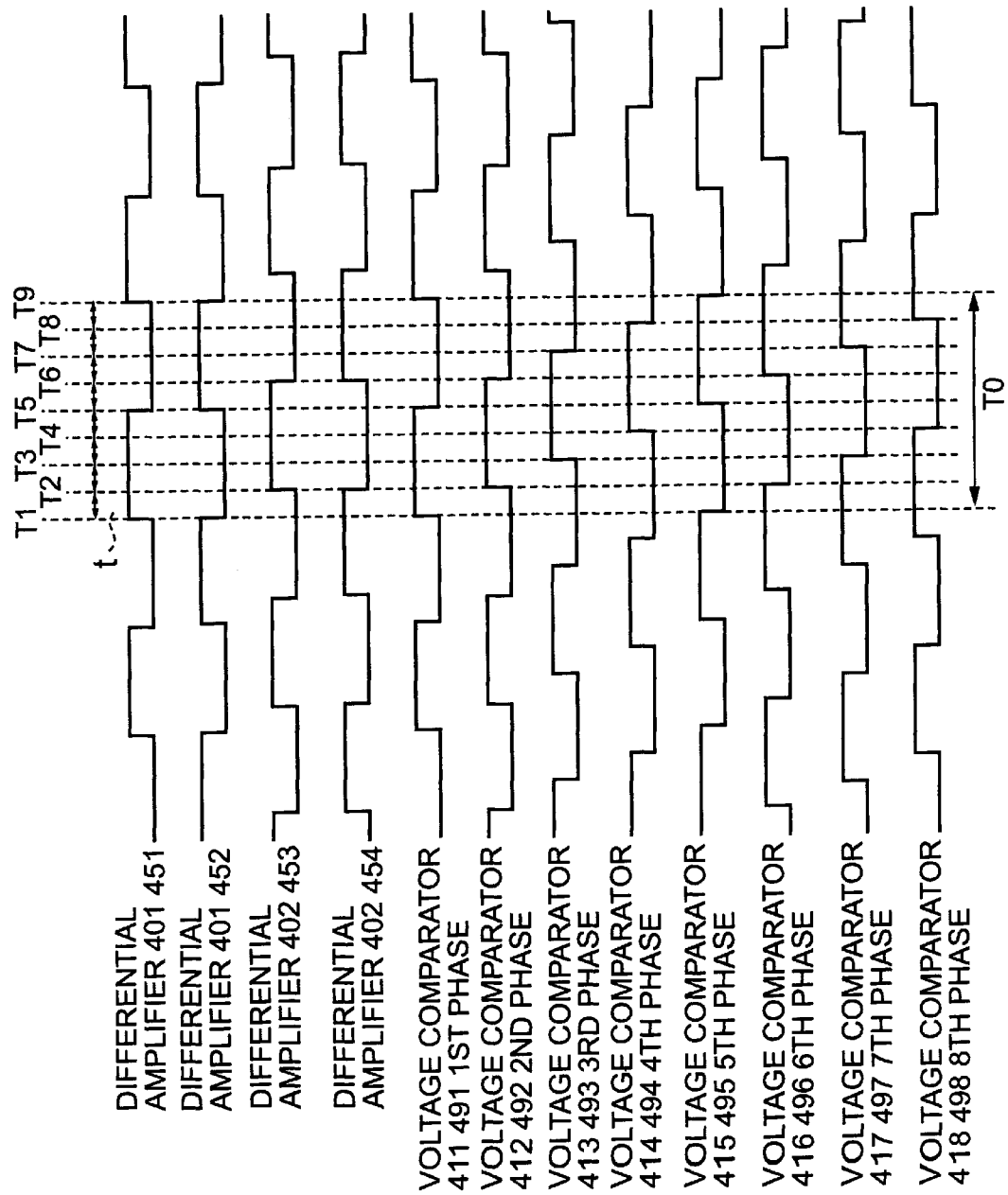
FIG. 12 is a waveform diagram for explaining an operation of the ring oscillator illustrated in FIG. 2.
Figure 13:
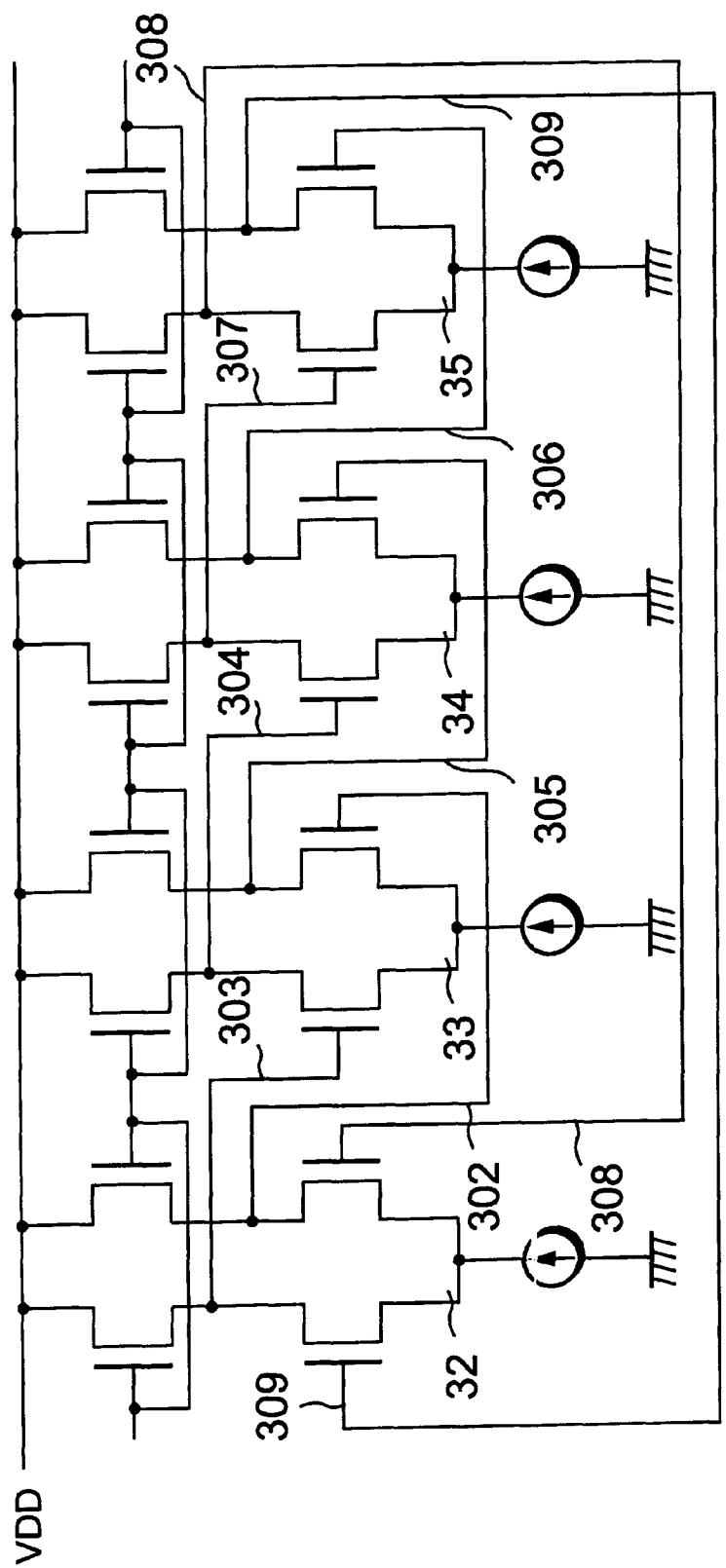
FIG. 13 is a circuit diagram showing connection state of the differential amplifier illustrated in FIG. 5.

Referring to FIG. 12, description will be made about the ring oscillator having the multi-phase clock outputs illustrated in FIG. 5.

In FIG. 12, the ring oscillator oscillates at oscillation frequency T0. At time T1–T5, the positive phase output 451 of the differential amplifier 401 is put into the high level while the negative phase output 452 is put into the low level. Consequently, the output 491 of the voltage comparator 411 becomes the high level while the output 495 of the voltage comparator 415 becomes the low level. At time T5–T9, the output of the differential amplifier 401 is reversed. In consequence, the output 491 of the voltage comparator 411 is put into the low level while the output 495 of the voltage comparator 415 is put into the high level.

Subsequently, at time T1, the positive phase output 451 of the differential amplifier 401 is changed from the low level into the high level while the negative phase output 452 is changed from the high level into the low level.

Consequently, the input of the next stage differential amplifier 402 is changed. Thereby, in the differential amplifier 402, the positive phase output 453 is changed from the low level into the high level, and the negative phase output 454 is changed from the high level into the low level at time T2 delayed with delay time t (=T2−T1) of the differential amplifier.

As a result, the output 492 of the voltage comparator 412 is changed into the high level while the output 496 of the voltage comparator 416 is changed into the low level.

Further, at time T5, the positive phase output 451 of the differential amplifier 401 is changed from the high level into the low level while the negative phase output 452 is changed from the low level into the high level.

Consequently, the input of the next stage differential amplifier 402 is changed. Thereby, in the differential amplifier 402, the positive phase output 453 is changed from the high level into the low level, and the negative phase output 454 is changed from the low level into the high level at time T6 delayed with delay time t (=T6−T5) of the differential amplifier.

As a result, the output 492 of the voltage comparator 412 is changed into the low level while the output 496 of the voltage comparator 416 is changed into the high level.

Hereinafter, the same operation is repeated. In consequence, waveform delayed with delay time of the differential amplifier is obtained at the same T0 with the oscillation frequency of the ring oscillator for outputs 491–498 of the voltage comparators 411–418.

Subsequently, description will be made about a detail operation of the ring oscillator illustrated in FIG. 6.

In the ring oscillator illustrated in FIG. 6, when the oscillation control signal 107 is equal to the high level, the P-type transistors P1–P4 and the N-type transistors N1–N4, each of which is given with the low level signal 301 by the reverse gate 31, become the OFF states and constitute the even stages of ring oscillator circuit.

When the input 308 of the differential amplifier 32 is equal to the high level and the input 309 is equal to the low level, the output 302 becomes the low level and the output 303 becomes the high level. After the next stage, the outputs 304, 306 are put into the low level while the outputs 305, 307 are put into the high level. Further, the output 309 of the final stage differential amplifier 35 becomes the high level while the output 308 becomes the low level.

The first stage of positive phase input is coupled to the final stage of negative phase output while the first stage of negative phase input is coupled to the final stage of positive phase output. Consequently, the input level of the differential amplifier 32 is reversed. Thereby, the output 302 is changed from the low level into the high level, and the output 303 is changed from the high level into the low level in the state. After the subsequent stage, the output state is sequentially reversed to oscillate. In this event, the oscillation frequency is depends upon the delay time of each differential amplifier.

When the oscillation control signal 107 is equal to the low level, the P-type transistors P1–P4 and the N-type transistors N1–N4, each of which is given with the high level signal 301 by the reverse gate 31, become the ON states. Consequently, all of the output terminals, in which the P-type transistors are connected, become the power supply line VDD while all of the output terminals of the differential amplifier, in which the N-type transistors are connected, become the ground line GND level.

Namely, all of output levels of the differential amplifiers 32–35 are put into unbalanced state and becomes the oscillationable state. From this state, the oscillation control signal 107 is put into the high level. Thereby, all of N1–N4, P1–P4 become the OFF states, potentials of the outputs 302–309 of the differential amplifiers 32–35 are changed from the power supply line VDD level or the ground line level GND into the intermediate potential level direction, respectively and becomes the oscillation state in the course.

Although description has been so far made about the operation of the ring oscillator of four stages differential amplifiers, the operation of even stages differential amplifier of 2×N number (N=1, 2, 3, . . . ) may be performed in the same manner.

Subsequently, description will be made about a detail operation of the differential amplifiers 32–35 which constitute the ring oscillator illustrated in FIG. 7.

The circuit, which is structured by the transistors 750–754, constitutes the normal amplifier circuit. When the high level is given to the input terminal 702 and the low level is given to the input terminal 703, the transistor 752 becomes the ON state and the output 706 is put into the low level. Further, transistor 753 becomes the OFF state and the output 705 is put into the high level.

The voltage 103 is applied to the control input terminals 701, 704 of the transistors 750, 751, 754 from the voltage generating circuit 20, and the delay time of the differential amplifier is variable in dependency upon the voltage 103. By utilizing this, the oscillation frequency of the ring oscillator is changed.

Further, the voltage is always applied to the control input terminals 707, 708 of the transistors 755–757 which are connected to these transistors in parallel so that the current always flows.

When the control input terminals 701, 704 approaches the power supply line VDD or the ground line GND in the transistors 750, 751, 754, the transistors 750, 751, 754 become the OFF state and no current flows. However, the current always flows along the transistors 755–757. Consequently, the circuit can operate as the differential amplifier.

The ring oscillator can be structured by the use of the differential amplifier. When the voltage applied from the voltage generating circuit 20 falls within the range between the power supply line VDD and the ground line GND, the voltage control oscillator is in the oscillationable state.

Figure 14:
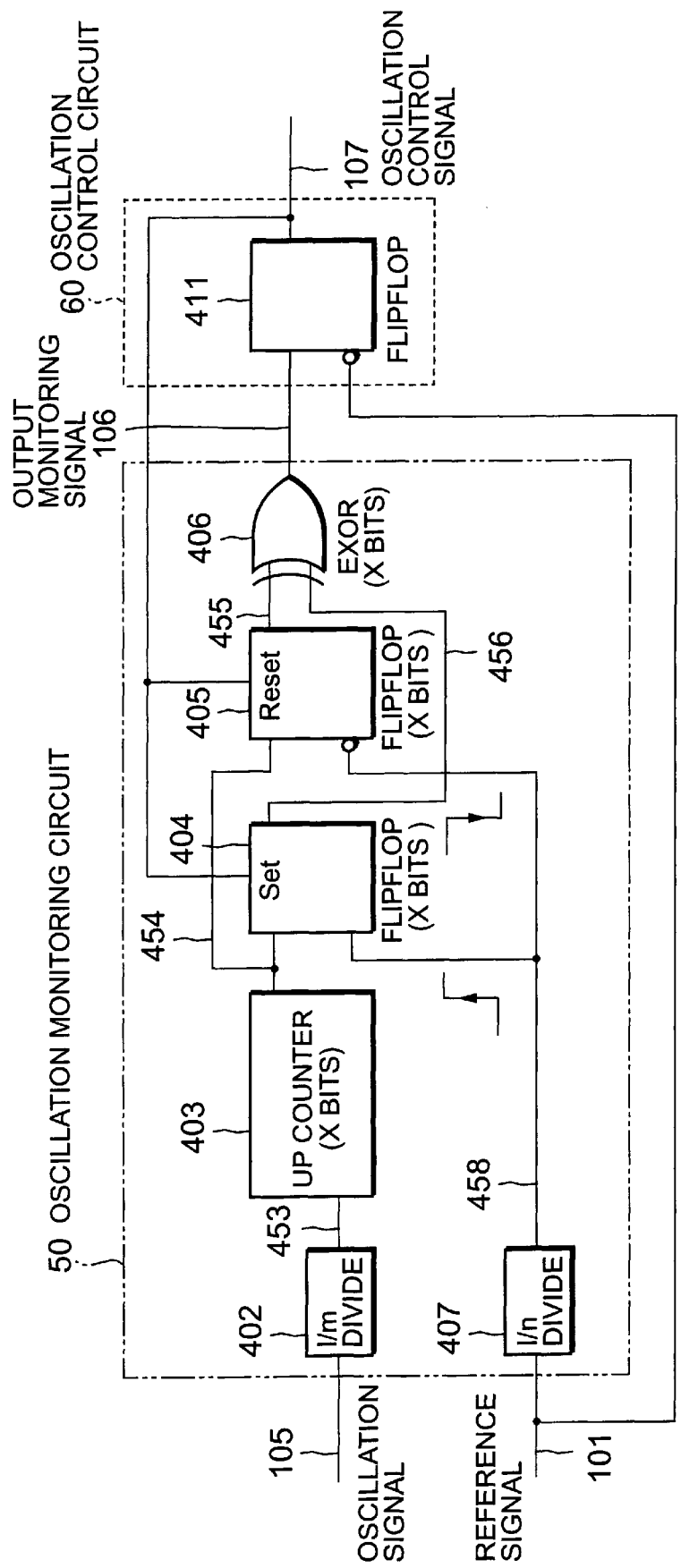
FIG. 14 is a circuit diagram showing the other embodiment of the oscillation monitoring circuit.

Subsequently, description will be made about another embodiment of this invention with reference to FIGS. 14 through 16.

Figure 15:
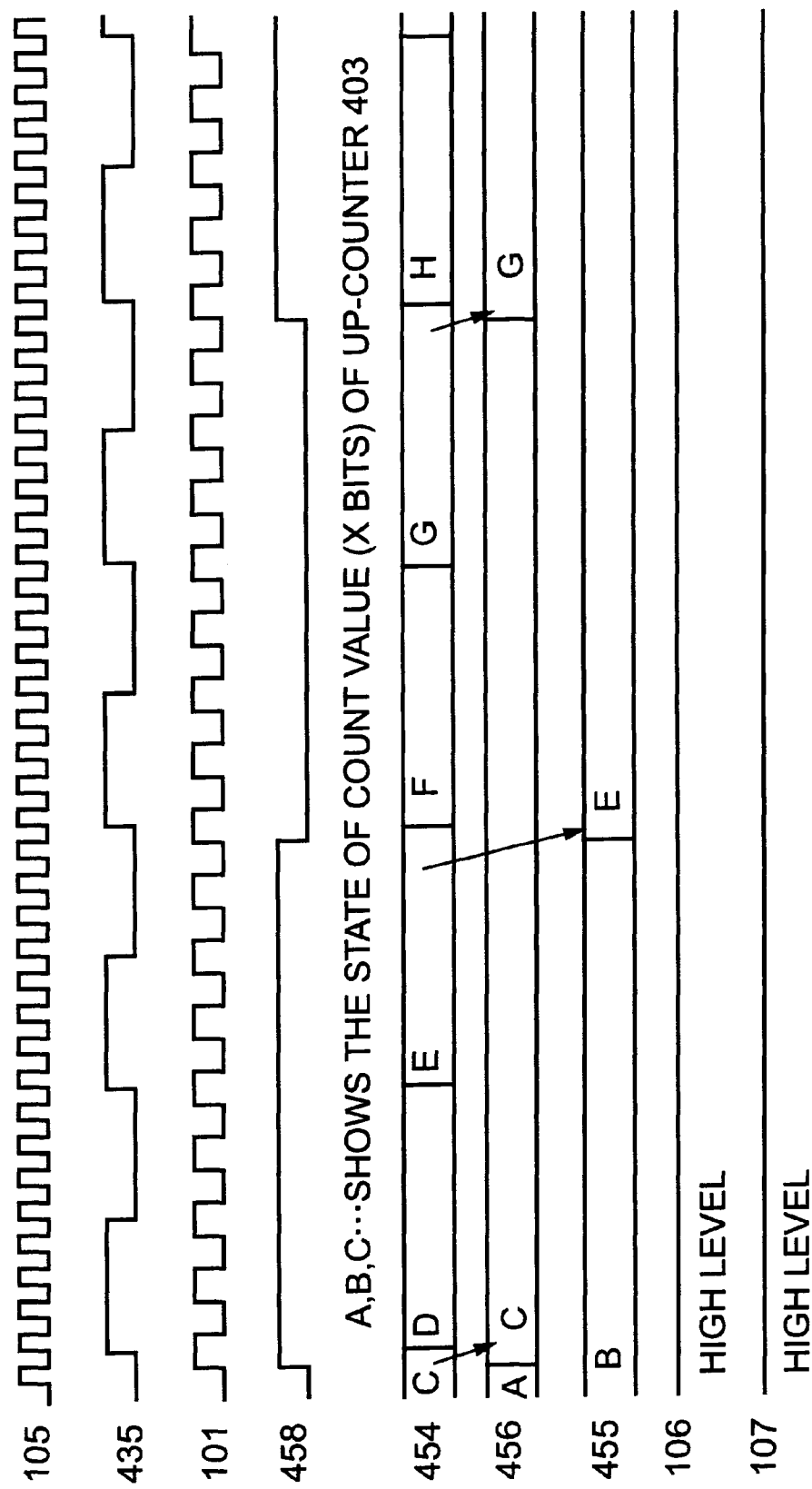
FIG. 15 is a waveform for explaining an operation of an oscillation state of the circuit illustrated in FIG. 14.

Referring to FIG. 15, after an oscillation signal 105 is divided into the m number by a divider 402 in an oscillation monitoring circuit 50, the divided signal is given to the up-counter 403 of X-bits, and the up-counter 403 performs up-count.

An output of the up-counter 403 is given to flip-flops 404, 405 of X-bits in X-bits state. The flip-flop 404 operates at a rising timing of a signal which is n-divided a referential signal 101 by the divider 407, and the flip-flop 405 operates at a falling timing. Thereby, a count value (X bits) of the up counter 403 is produced and retained.

When the PLL circuit normally operates, the output signals 456, 455 of the flip-flops 404, 405 are always put into different state. Under this circumstance, the monitor signal 106 produces the high level which indicates the oscillation state.

Herein, the monitor signal 106 is equal to an output of an exclusive OR-gate 406 which is given with the output signal 456 of the flip-flop 404 and the output signal 455 of the flip-flop 405.

Further, the oscillation control signal 107 as the output of the oscillation control circuit 60 also becomes the high level, and the voltage control oscillator 30 is not particularly controlled.

Subsequently, when the oscillation of the PLL oscillator, the input of the up-counter 403 becomes a constant level with reference to FIG. 16 after the oscillation halts. Therefore, the up-count is not carried out, and the output state is invariable.

Figure 16:
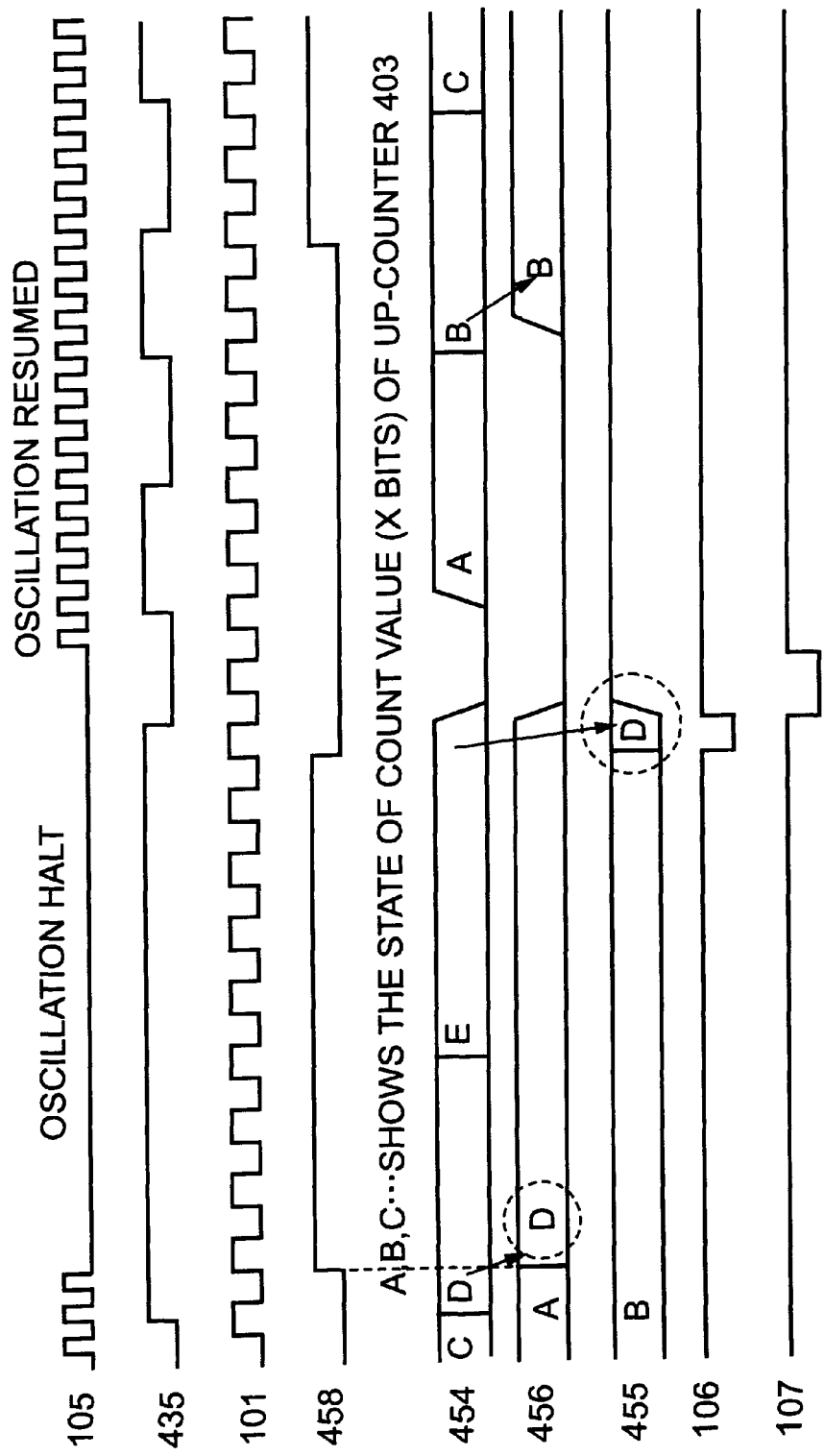
FIG. 16 is a waveform for explaining an operation of an oscillation state of the circuit illustrated in FIG. 14.

Consequently, the outputs 456, 455 of the flip-flops 404, 405 become the same states (DH in FIG. 16). Further, the monitor signal 106 as the output of the exclusive OR-gate 406 produces the low level which indicates the oscillation halting state, and the oscillation control signal 107 as the output of the oscillation control circuit 60 becomes the low level when the referential signal 101 falls so as to reset the voltage control oscillator 30 into the oscillationable state.

Moreover, the oscillation control signal 107 puts the flip-flop 404 of the oscillation monitoring circuit 50 into the set state (high level output), puts the flip-flop 405 into the reset state (low level output), and puts the output of the exclusive OR-gate 406 into the high level. Thereby, the oscillation control signal 107 is put into the high level when the referential signal 101 subsequently falls.

What is claimed is:

1. A PLL circuit which detects oscillation halt of a voltage control oscillator and which generates an oscillation control signal for automatically oscillating the voltage control oscillator based upon the detected signal, and which automatically restores the voltage control oscillator to a normal oscillation state by the use of the generated signal, wherein:

said voltage control oscillator is structured by a ring oscillator in which a plurality of differential amplifiers are connected in a ring form, a plurality of oscillation control means are arranged for the respective inputs of said differential amplifiers so as to set said ring oscillator into an oscillationable state when said voltage control oscillator halts, and said oscillation control means is controlled by the oscillating control signal.

2. A PLL circuit as claimed in claim 1, wherein:

the number of said differential amplifiers is even.

3. A PLL circuit as claimed in claim 1, wherein:

said oscillation control means pulls-up one input of said differential amplifier into a high level and pulls-down the other input of said differential amplifier into a low level.

4. A PLL circuit as claimed in claim 3, wherein:

said oscillation control means comprises a first oscillation control means which pulls-up the one input of said differential amplifier into the high level and a second oscillation control means which pulls-down the other input of said differential amplifier into the low level.

5. A PLL circuit as claimed in claim 4, wherein:

said first oscillation control means comprises a p-channel transistor which is connected between the one input of said differential amplifier and a power supply line, and said second oscillation control means comprises an n-channel transistor which is connected between the other input of said differential amplifier and a ground line.

6. A PLL circuit as claimed in claim 1, wherein:

the circuit has second and third differential amplifiers, one output of said differential amplifier constituting said ring oscillator is introduced to a non-reverse input terminal of said second differential amplifier while the other output of said differential amplifier is introduced to a reverse input terminal of said second differential amplifier, one output of said differential amplifier constituting said ring oscillator is introduced to a reverse input terminal of said third differential amplifier while the other output of said differential amplifier is introduced to a non-reverse input terminal of said third differential amplifier, and thereby, a plurality of frequencies are generated, each of the frequency having a predetermined phase difference for said ring oscillator.

7. A PLL circuit as claimed in claim 1, wherein:

the circuit has a detection circuit which detects the oscillation halt of said voltage control oscillator, said detection circuit comprises;

a divider which divides the oscillation signal of said voltage control oscillator, a first data retaining means for retaining a first output signal which is given from said divider at a first time, a second data retaining means for retaining a second output signal which is given from said divider at a second time after a predetermined time from the first time, and an exclusive OR gate which detects the presence or absence of difference between the first output signal and the second output signal, and each of said first data retaining means and said second data retaining means is reset by the use of the oscillation control signal.

8. A PLL circuit as claimed in claim 1, wherein:

the circuit has a detection circuit which detects the oscillation halt of said voltage control oscillator, said detection circuit comprises;

a divider which divides the oscillation signal of said voltage control oscillator, a plurality of shift registers which sequentially shift the divided signals, and an exclusive OR gate which detects the presence or absence of difference between an input signal and an output signal of each shift register, and each of said shift registers is reset by the use of the oscillation control signal.

9. A PLL circuit which has a voltage control oscillator in which a plurality of differential amplifiers are in a ring form and which detects oscillation halt of the voltage control oscillator and automatically restores the voltage control oscillator to a normal oscillation state by the use of the detected signal, wherein:

when said voltage control oscillator halts the oscillation, inputs of said differential amplifiers are unbalanced so as to set said ring oscillator to an oscillationable state, and thereby, each of said differential amplifiers is put into an unbalanced state.

10. A PLL circuit as claimed in claim 9, wherein:

the number of said differential amplifiers is even.

* * * * *